US012640736B2

(12) United States Patent (10) Patent No.: US 12,640,736 B2
Kamagond et al. (45) Date of Patent: May 26, 2026

(54) INPUT/OUTPUT CIRCUIT WITH SLEW RATE CONTROL

(71) Applicant: TEXAS INSTRUMENTS INCORPORATED, Dallas, TX (US)

(72) Inventors: Trilok Kamagond, Bengaluru (IN); Sumantra Seth, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 38 days.

(21) Appl. No.: 18/931,163

(22) Filed: Oct. 30, 2024

(65) Prior Publication Data

US 2026/0121639 A1 Apr. 30, 2026

(51) Int. Cl.
*H03K 19/003* (2006.01)

(52) U.S. Cl.
CPC .............................. *H03K 19/00315* (2013.01)

(58) Field of Classification Search
None
See application file for complete search history.

(56) References Cited

U.S. PATENT DOCUMENTS

| | | | | |
|---|---|---|---|---|
| 6,586,974 | B1 * | 7/2003 | Humphrey | ..... H03K 19/018521 |
| | | | | 326/82 |
| 6,646,483 | B2 * | 11/2003 | Shin | ................. H03K 19/00384 |
| | | | | 327/170 |
| 6,829,177 | B2 * | 12/2004 | Bedarida | ................. G11C 16/26 |
| | | | | 365/189.05 |
| 6,894,547 | B2 * | 5/2005 | Takahashi | ...... H03K 19/018585 |
| | | | | 327/170 |
| 7,170,324 | B2 * | 1/2007 | Huber | .................. H03K 17/163 |
| | | | | 326/82 |
| 7,839,200 | B2 * | 11/2010 | Im | ......................... G11C 7/1057 |
| | | | | 327/170 |
| 8,456,211 | B2 * | 6/2013 | Chen | ........................ H03K 5/04 |
| | | | | 327/170 |
| 9,484,891 | B2 * | 11/2016 | Amirkhany | .............. H03K 3/01 |
| 10,777,234 | B2 * | 9/2020 | Shido | .................. G11C 11/4096 |
| 12,160,237 | B2 * | 12/2024 | Kumar | ............. H03K 19/00384 |

* cited by examiner

*Primary Examiner* — Cassandra F Cox

(74) *Attorney, Agent, or Firm* — Xianghui Huang; Frank D. Cimino

(57) ABSTRACT

A circuit includes a first transistor having a control terminal and includes a predriver having an input and an output. The output is coupled to the control terminal of the first transistor. A second transistor of a first polarity has a control terminal coupled to the output of the predriver. A third transistor of a second polarity has first and second terminals. The first terminal of the third transistor is coupled to the control terminal of the second transistor. A fourth transistor having the second polarity has first and second terminals. The first terminal of the fourth transistor is coupled to the second terminal of the third transistor. The second terminal of the fourth transistor is coupled to a supply terminal.

20 Claims, 6 Drawing Sheets

INPUT/OUTPUT CIRCUIT WITH SLEW RATE CONTROL

BACKGROUND

Many circuits, both analog and digital, have one or more inputs and one or more outputs. An input/output (I/O)) circuit is a circuit that is often used to output a signal through an integrated circuit's (IC's) I/O terminals (also referred to as pins). An IC may have multiple I/O terminals and, accordingly, may have a separate I/O circuit associated with one or more of the I/O terminals.

Some applications, such as automotive applications, are sensitive to electromagnetic interference (EMI). Accordingly, the I/O circuits in ICs in such applications may include slew rate control to limit the slopes of the rising and falling edges on the I/O terminals to limit the magnitude of EMI generated by one IC from detrimentally impacting the operations of other circuits within the system.

SUMMARY

In one example, a circuit includes a first transistor having a control terminal and includes a predriver having an input and an output. The output is coupled to the control terminal of the first transistor. A second transistor of a first polarity has a control terminal coupled to the output of the predriver. A third transistor of a second polarity has first and second terminals. The first terminal of the third transistor is coupled to the control terminal of the second transistor. A fourth transistor having the second polarity has first and second terminals. The first terminal of the fourth transistor is coupled to the second terminal of the third transistor. The second terminal of the fourth transistor is coupled to a supply terminal.

DETAILED DESCRIPTION

Figure 1:
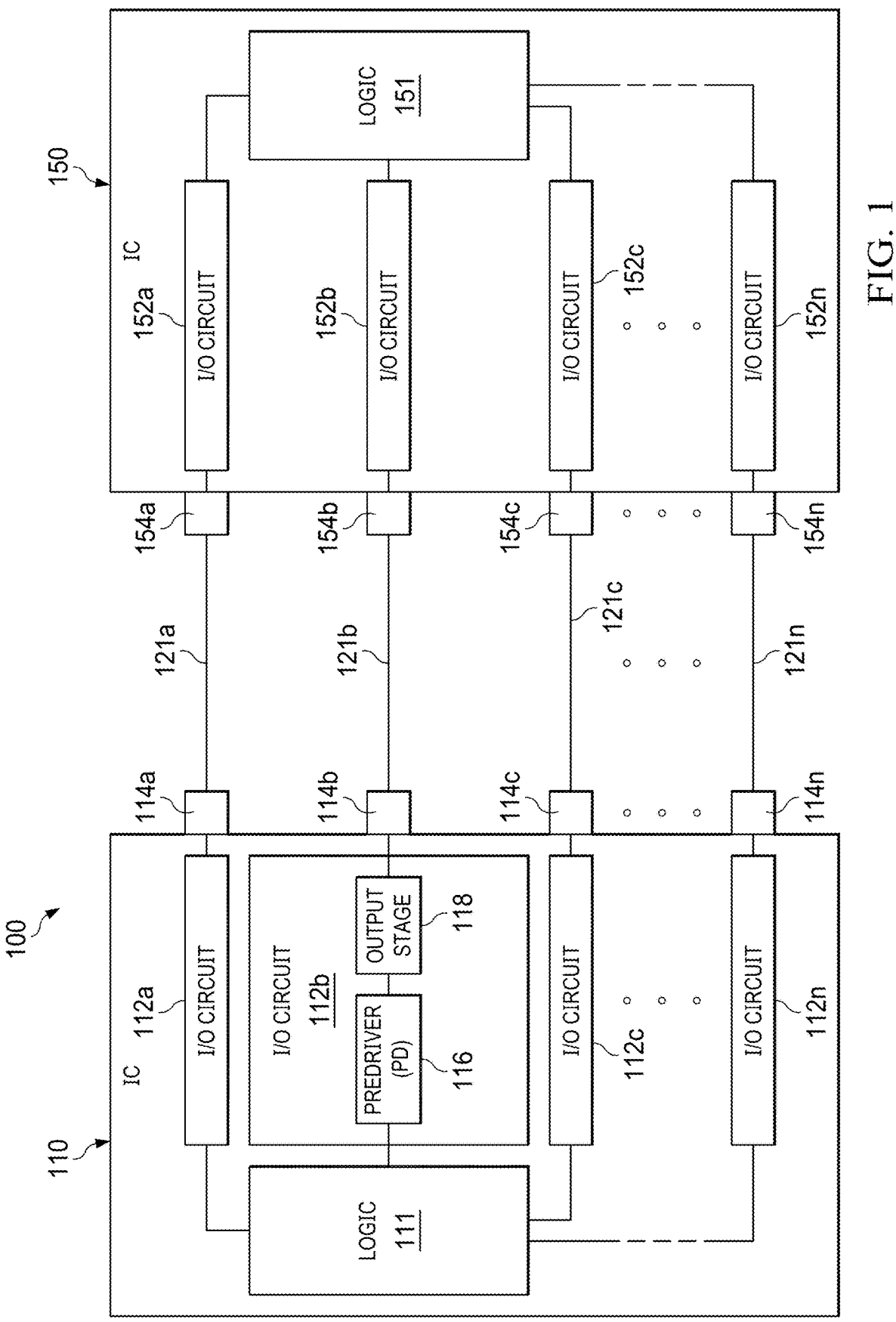
FIG. 1 is a block diagram of a system including two integrated circuits (ICs) coupled together, in an example.

The same reference numbers or other reference designators are used in the drawings to designate the same or similar (either by function and/or structure) features.

The examples described herein are of an input/output (I/O) circuit including slew rate control for use in an integrated circuit (IC). Although the description herein pertains to an I/O circuit, the principles described herein are applicable to other types of circuits.

Some I/O circuits implement slew rate control by including a resistor in the gate charge path of an n-channel field effect transistor (NFET) or in the gate discharge path for a p-channel field effect transistor (PFET). NFETs and PFETs are different polarity transistors. The resistor and the gate capacitance of the corresponding field effect transistor (FET)

limits the rate of change of the gate-to-source voltage (Vgs) of the FET and, accordingly, limits the rate of change of the I/O terminal to which the FET is coupled and limits the magnitude of EMI generated by the IC. Unfortunately, the same resistor, which is useful to implement slew rate control, also delays turning on of the channel within the corresponding FET. Such delays can make it difficult for the IC to meet the timing requirements of some interface protocols such as Ethernet medium access control (MAC) interfaces including, for example, media-independent interface (MII), reduced media-independent interface (RMII), and reduced gigabit media-independent interface (RGMII).

The examples described herein are directed to an I/O circuit that includes slew rate control and also includes one or more turn-on circuits whose purpose is to rapidly turn on the corresponding FET and then automatically turn off to allow the slew rate control feature of the I/O circuit to limit the slew rate of the rising or falling signal edge on the I/O terminal. In one example, the I/O circuit includes two turn-on circuits-one turn-on circuit associated with a predriver for a PMOS transistor within an output stage of the I/O circuit and another turn-on circuit associated with a predriver for an NMOS transistor within the output stage. Advantageously, the speeds at which both turn-on circuits turn on their corresponding output stage FET and then automatically shutoff are approximately the same despite process variation between PMOS and NMOS transistors in the same IC. Process variations may cause the PMOS transistors to be "stronger" than the NMOS transistors, or vice versa. A stronger FET has a relatively low threshold voltage and relatively high electron mobility compared to a weaker FET. The disclosed turn-on circuits operate at approximately the same speed as each other despite any process variations between transistor polarities (types).

FIG. 1 is a block diagram of a system 100 in which an IC 110 is coupled to an IC 150. Other ICs and other electrical components may be included in system 100 as well. IC 110 has I/O terminals 114a, 114b, 114c, . . . , 114n (collectively, I/O terminals 114). I/O terminals are externally-accessible terminals-accessible to circuits external to the IC. IC 150 has I/O terminals 154a, 154b, 154c, . . . , 154n (collectively, I/O terminals 154). I/O terminals 114a-114n are coupled to corresponding I/O terminals 154a-154n by corresponding electrical conductors 121a, 121b, 121c, . . . 121n (collectively, conductors 121). Two or more electrical conductors 121a-121n may be part of a single electrical cable.

IC 110 includes logic 111 and I/O circuits 112a, 112b, 112c, . . . , 112n (collectively, I/O circuits 112). Each I/O circuit 112a-112n has an input coupled to logic 111 and an output coupled to the corresponding I/O terminal. IC 150 is similarly configured. IC 150 includes logic 151 and I/O circuits 152a, 152b, 152c, . . . , 152n (collectively, I/O circuits 152). Each I/O circuit 152a-152n has an input coupled to logic 151 and an output coupled to the corresponding I/O terminal. Logic 111 and logic 151 may include microcontrollers or discrete digital logic. Logic 111 of IC 110 can generate a signal to send to logic 151 of IC 150 by way of one or more of the I/O pins 114a-114n and 154a-154n. Similarly, logic 151 can generate a signal to send to logic 111 by way of one or more of the I/O pins. Accordingly, any of the I/O terminals may be bidirectional by which one of the ICs can send a signal to or receive a signal from the other IC. In some examples, one or more of the I/O terminals may be unidirectional in which only one of the ICs can send a signal to other IC.

I/O circuit 112b is shown in FIG. 1 as including a predriver (PD) 116 coupled to an output stage 118. One or more of the other I/O circuits 112a, 112c, . . . , 112n and 154a, 154b, 154c, . . . , 154n may be similarly configured. As described below, the predriver 116 of I/O circuit 112b includes a slew rate control capability to limit the slope of the rising and falling edges of the corresponding I/O terminal 114b. Further, predriver 116 includes or is coupled to one or more turn-on circuits. The turn-on circuit helps to reduce the delay at which a transistor in the output stage 118 turns on compared to the delay that would otherwise occur absent the turn-on circuit.

Figure 2:
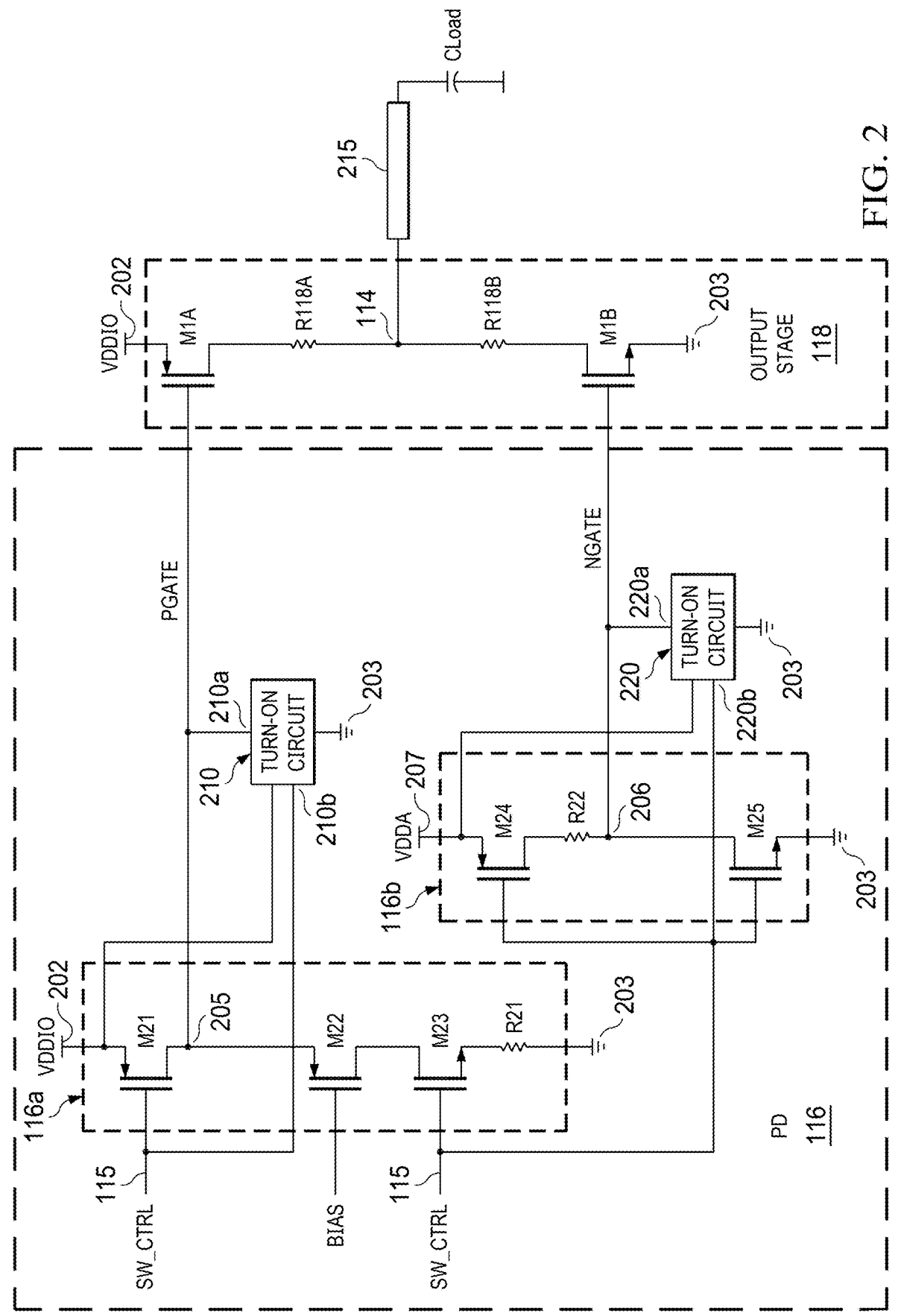
FIG. 2 is a schematic diagram of an I/O circuit included in the ICs of FIG. 1, in an example.

FIG. 2 is a schematic diagram of predriver 116 and output stage 118 of an I/O circuit (e.g., any of I/O circuits 112a, 112b, 112c, . . . , 112n or I/O circuits 152a, 152b, 152c, . . . , 152n). Turn-on circuits 210 and 220 are included as well and described below. Output stage 118 includes transistors MIA and MIB. In this example, transistors MIA and MIB are field effect transistors (FETs) with transistor MIA being a p-channel FET (PFET) and transistor MIB being an n-channel FET (NFET). The source of transistor MIA is coupled to a voltage terminal 202 (VDDIO). Voltage terminal 202 may be an externally-accessible terminal (e.g., external to IC 110, 150), and voltage VDDIO may be an externally-supplied voltage.

Predriver 116 includes a predriver 116a for transistor MIA and a predriver 116b for transistor MIB. The drains of transistors MIA and MIB are coupled together at the I/O terminal 114, and the source of transistor MIB is coupled to a voltage terminal 203 (e.g., ground). Reference numeral 215 refers to the characteristic impedance of conductor 121 coupling the I/O terminal 114 to an I/O terminal (e.g., I/O terminal 154) of another IC. In the example of FIG. 1, resistors R118A and R118B are included and coupled between the drains of transistors MIA and MIB for impedance matching purposes (e.g., to match the output impedance of the I/O circuit to the characteristic impedance of conductor 121. Capacitance CLoad refers to the capacitive load imposed on the I/O terminal 114 by the parasitic capacitance of the conductor 121 and the I/O circuit of the IC to which conductor 121 is coupled.

Predriver 116a includes transistors M21, M22, M23, and resistor R21. Transistors M21 and M22 are PFETs and transistor M23 is an NFET. The source of transistor M21 is coupled to the voltage terminal 202. The drain of transistor M21 is coupled to the source of transistor M22 at terminal 205 and to the gate of transistor MIA in output stage 118. The voltage on terminal 205 to the gate of transistor MIA is PGATE. When the PGATE voltage is at least a threshold voltage of transistor MIA below VDDIO, transistor MIA is on, and if the PGATE voltage is not at least a threshold voltage below VDDIO, transistor MIA is off.

The input signal to predrivers 116a and 116b is the SW_CTRL signal 115 (e.g., the signal from logic 111 or logic 151). The SW_CTRL signal 115 is provided to the gates of transistors M21 and M23 in predriver 116a. The gate of transistor M22 receives a bias voltage (BIAS). In the example of FIG. 1, in response to a logic low level of the SW_CTRL signal 115, transistor M21 is on and transistor M23 is off. With transistor M21 being on, the PGATE voltage is pulled high to approximately the VDDIO voltage thereby turning transistor MIA off.

In response to a logic low high of the SW_CTRL signal 115, transistor M21 turns off and transistor M23 turns on. Ignoring for the moment turn-on circuit 210, with transistor M23 on, a current path exists through transistors M22 and M23 and resistor R21 to discharge the gate capacitance of transistor MIA to thereby turn on transistor MIA. As the channel of transistor MIA opens, current flows through transistor MIA to capacitance CLoad, which begins to charge, and the drain voltage of transistor MIA begins to increase toward VDDIO. The RC time constant formed by the parasitic capacitance (e.g., the gate capacitance) of transistor MIA and resistor R21 controls the slew rate of the rising edge at I/O terminal 114 when transistor MIA turns on.

Predriver 116b includes transistors M24 and M25 and resistor R22. Transistor M24 is a PFET, and transistor M25 is an NFET. The sources of transistors M24 and M25 are coupled to voltage terminals 207 and 203, respectively. Voltage terminal 207 has a voltage VDDA, which may be a regulated voltage generated internally to the IC containing the I/O circuit. In one example, voltage VDDA is lower than voltage VDDIO. The drain of transistor M24 is coupled to one terminal of resistor R22, and the drain of transistor M25 is coupled to the other terminal of resistor R22 and to the gate of transistor MIB in output stage 118. The SW_CTRL signal is provided to the gates of transistors M24 and M25. The voltage on terminal 206 to the gate of transistor MIB is NGATE. When the NGATE voltage is at least a threshold voltage of transistor MIB above ground, transistor MIB is on, and if the NGATE voltage is not at least a threshold voltage above ground, transistor MIB is off.

In response to a logic high of the SW_CTRL signal 115, transistor M25 is on and transistor M24 is off. With transistor M25 being on, the NGATE voltage is pulled low to approximately the ground potential thereby turning transistor MIB off. In response to a logic low of the SW_CTRL signal 115, transistor M25 turns off and transistor M24 turns on. Ignoring for the moment turn-on circuit 220, with transistor M24 being on, a current path exists from voltage terminal 207 and through transistor M24 and resistor R22 to charge the gate capacitance of transistor MIB thereby turning on transistor MIB. As the channel of transistor MIB opens and the drain of transistor begins to decrease toward ground, current flows from voltage terminal 207, through transistor M24 and resistor R22 the parasitic capacitance of transistor MIB (e.g., the gate-to-drain capacitance) to ground. The RC time constant formed by the parasitic capacitance of transistor MIB and resistor R22 controls the slew rate of the falling edge at I/O terminal 114 when transistor MIB turns on.

As described above, resistors R21 and R22 help to control the slew rate of the rising and falling edges on I/O terminal 114. Unfortunately, the RC time constant of resistor R21 and the gate-to-source capacitance of transistor MIA also delays turning on the channel of transistor MIA because current discharging from the gate of transistor MIA flows through resistor R21 thereby reducing the rate at which the gate voltage for transistor MIA reaches the threshold voltage. Similarly, the RC time constant of resistor R22 and the gate-to-source capacitance of transistor MIB also delays turning on the channel of transistor MIB because current charging the gate of transistor MIB flows through resistor R22.

Turn-on circuit 210 is shown separate from, but coupled to, predriver 116a. Similarly, turn-on circuit 220 is shown separate from, but coupled to, predriver 116b. However, turn-on circuits 210 and 220 may be part of their respective predrivers 116a, 116b.

Turn-on circuit 210 reduces the delay at which transistor MIA turns on. Turn-on circuit 210 has a terminal 210a coupled to terminal 205 and has an input 210b to receive the SW_CTRL signal 115. In response to the SW_CTRL signal 115 being logic high, turn-on circuit 210 causes the PGATE voltage to decrease more rapidly than would have been the case absent turn-on circuit 210. Upon the PGATE voltage falling to the threshold voltage for transistor MIA, transistor MIA turns on and the functionality of turn-on circuit 210 automatically disables to further pull the PGATE voltage down thereby allowing the slew rate control functionality of resistor R21 within predriver 116a to help control the slew rate of the rising edge on I/O terminal 114.

Similarly, turn-on circuit 220 reduces the delay at which transistor MIB turns on. Turn-on circuit 220 has a terminal 220a coupled to terminal 206 and has an input 220b to receive the SW_CTRL signal 115. In response to the SW_C-TRL signal 115 being logic low, turn-on circuit 220 causes the NGATE voltage to increase more rapidly than would have been the case absent turn-on circuit 220. Upon the NGATE voltage increasing to the threshold voltage for transistor MIB, transistor MIB turns on and the functionality of turn-on circuit 220 automatically disables to further pull the NGATE voltage up thereby allowing the slew rate control functionality of resistor R22 within predriver 116b to help control the slew rate of the falling edge on I/O terminal 114.

As described above, due to process variations when fabricating an IC, the IC's PFETS may be stronger or weaker than the IC's NFETs. Such a difference between PFETs and NFETs within the IC could cause the turn-on circuit 210 to operate more rapidly than, or slower than, turn-on circuit 220. A faster operating turn-on circuit may cause its corresponding output stage transistor to turn on with less delay than a slower turn-on circuit may cause its corresponding output stage transistor to turn on. However, turn-on circuits 210 and 220 described herein advantageously operate with approximately the same speed despite process variations between the different polarities of FETs within the turn-on circuits.

Figure 3:
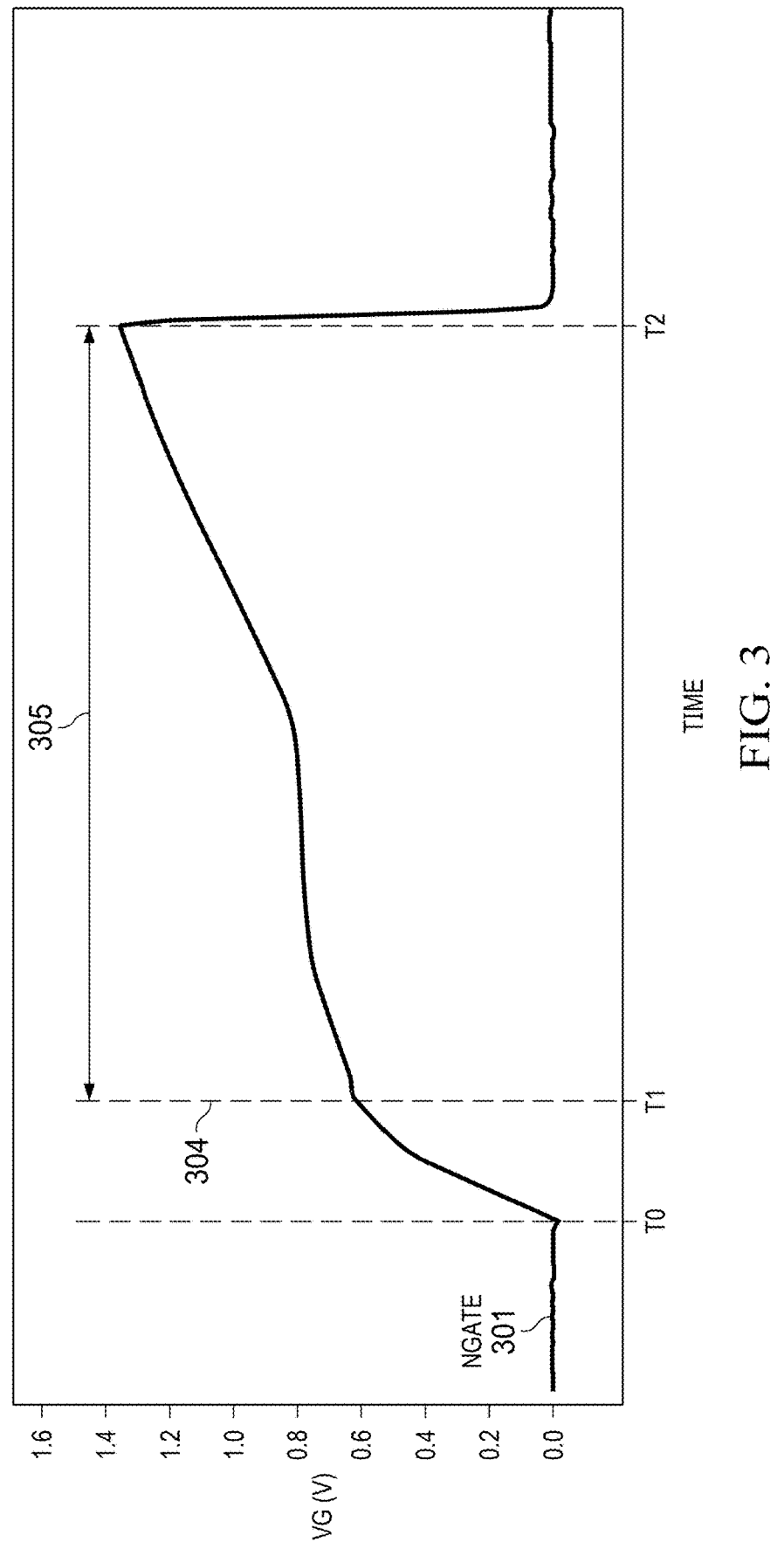
FIG. 3 is a graph illustrating the gate voltage of a transistor of the I/O circuit of FIG. 2, in an example.

FIG. 3 is a graph 301 illustrating the progression of the gate voltage NGATE of transistor MIB as transistor MIB turns on. At time T0, the SW_CTRL signal 115 to is forced low to cause predriver 116b with the assistance of turn-on circuit 220 to turn on transistor MIA while causing predriver 116a to turn off transistor MIA. Turn-on circuit 220 provides a current path (described below) to charge the gate capacitance of transistor MIB which causes the NGATE voltage to rise starting at time point T0. At time point T1, the gate voltage reaches the threshold voltage of transistor MIB thereby causing transistor MIB to turn on. Turn-on circuit 220 causes the rapid rise in the gate voltage between time points T0 and T1. When the NGATE voltage reaches the threshold voltage of transistor M1B, not only does transistor MIB turn on but turn-on circuit 220 automatically turns off allowing the slew rate control implemented by resistor R22 to more gradually increase the gate voltage of transistor MIB between time points T1 and T2. At time point T2, the SW_CTRL signal 115 is forced high to cause predriver 116b to turn transistor MIB off and to cause predriver 116a to turn transistor MIA on. Because resistor R22 is in the current path to charge the gate of transistor MIB but not in the current path through transistor M25 to discharge the gate of transistor MIB, transistor MIB turns off very rapidly (now slew rate control). Instead, the slew rate control within predriver 116a controls the slew rate through transistor MIA.

Figure 4:
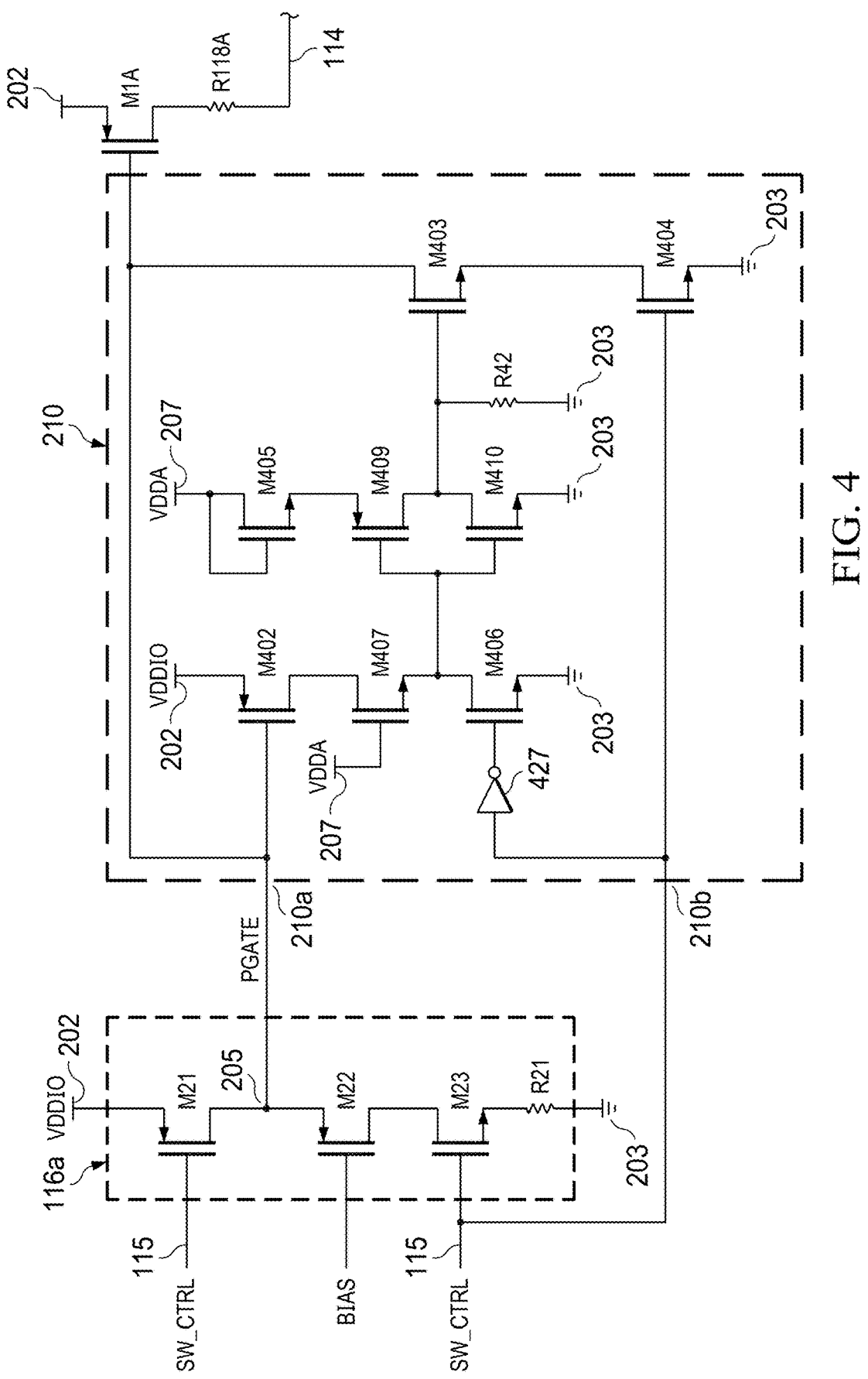
FIG. 4 is a schematic diagram of a predriver and turn-on circuit within the I/O circuit, in an example.

FIG. 4 is a schematic diagram of turn-on circuit 210 which is coupled to terminal 205 of predriver 116a. Turn-on circuit 210 includes transistors M402, M403, M404, M405, M406, M407, M409, and M410, resistor R42, and inverter 427. Transistors M402 and M409 are PFETs and transistors M403-M407 and M410 are NFETs. The source of transistor M402 is coupled to voltage terminal 202. The drains of transistors M402 and M407 are coupled together. The gate of transistor M402 is coupled to terminal 210a of turn-on circuit 210, to terminal 205 of predriver 116a, and to the gate of transistor MIA. The source of transistor M407 is coupled to the drain of transistor M406 and to the gates of transistors M409 and M410. The source of transistor M406 is coupled to the voltage terminal 203. The gate of transistor M407 is coupled to the voltage terminal 207 and, accordingly, receives the regulated voltage VDDA.

The gate and drain of transistor M405 are coupled to voltage terminal 207. The sources of transistors M405 and M409 are coupled together. Transistor M405 ensures that the voltage on the source of transistor M409 is a threshold voltage of transistor M405 below voltage VDDA. The drains of transistors M409 and M410 are coupled together and to the gate of transistor M403. Resistor R42 is coupled between the gate of transistor M403 and voltage terminal 203. The drain of transistor M403 is coupled to the gate of transistor MIA. The source of transistor M403 is coupled to the drain of transistor M404. The source of transistor M404 is coupled to the voltage terminal 203. The gate of transistor M404 is coupled to input 210b of turn-on circuit 210 and receives the SW_CTRL signal 115. The input 210b is coupled to the input of inverter, and the output of inverter 427 is coupled to the gate of transistor M406.

In response to the SW_CTRL signal 115 being logic low, transistor M21 is on and the PGATE voltage is pulled high thereby turning off transistor MIA. With the PGATE voltage pulled high, transistor M402 is off. Further, with the SW_C-TRL signal 115 being logic low, transistor M406 is on and transistor M404 is off. With transistor M406 being on, the gate of transistor M409 is pulled low thereby turning on transistor M409. With transistor M404 off, the Vgs of transistor M403 is close to the threshold of transistor 403 and, accordingly, transistor M403 also is off.

In response to the SW_CTRL signal 115 being logic high, transistor M21 turns off and transistor M23 turns on. Further, a logic high level for the SW_CTRL signal 115 causes transistor M404 to turn on and transistor M406 to turn off. The gate voltage for transistors M409 and M410 will remain low because transistor M402 is not yet on to otherwise charge the gate capacitance of transistor M410. With transistor M409 still on and transistor M404 now on, transistor M403 turns on as well.

Transistors M403 and M404 both being on provides a fast discharge current path to discharge the gate capacitance of transistor MIA. The discharge current path to discharge the gate of transistor MIA to thereby turn it on does not include resistor R21 and, accordingly, transistor MIA turns on much faster than would have been the case absent turn-on circuit 210.

When the PGATE voltage falls below the threshold voltage for transistor MIA, not only does transistor MIA turn on but transistor M402 also turns on. With transistor M402 being on, the gate voltage for transistors M409 and M410 is pulled upward to approximately one-threshold voltage of transistor M407 below voltage VDDA, which causes transistor M410 to turn on and transistor M409 to turn off. Transistor M405 provides a voltage on the source of transistor M409 that is one threshold voltage below voltage VDDA ensuring that transistor M409 turns off when its gate voltage also is one threshold voltage below voltage VDDA. Transistor M410 turning on causes the gate capacitance of transistor M403 to discharge thereby causing transistor M403 to turn off. With transistor M403 off, the fast discharge current path through turn-on circuit 210 to discharge the gate capacitance of transistor MIA disables and the slew rate control implemented by further discharging the gate of transistor MIA through transistors M22 and M23 and resistor R21 dominates the continued discharging of the gate of transistor MIA.

In turn-on circuit 210, transistor M402 is a PFET and transistors M403 and M404 are NFETs. Accordingly, the polarity of transistors M403 and M404 are of opposite polarity as transistor M402. The time it takes to turn on a PFET such as transistors MIA and M402 is the time it takes to discharge the gate capacitance of the PFET. The time rate of change of the voltage (dv/dt) across a capacitor is proportional to the ratio of the discharge current to the capacitance of the capacitor. That is, $$\frac{dv}{dt} = \frac{i}{c} \qquad \text{(Eq. 1)}$$

where "i" is the discharge current of the gate capacitance and "c" is the gate capacitance. As described above, due to process variations, one polarity of FETs may be stronger than the other polarity. For example, PFETs may be stronger than NFETs, or NFETs may be stronger than PFETs. It takes less time for a stronger FET's gate voltage to reach the transistor's threshold voltage for the same gate charge/discharge current than for a weaker FET. In the case in which PFETs are stronger than NFETs in the IC containing turn-on circuit 210, transistor M402 will be stronger than transistors M403 and M404. Transistors M403 and M404 being weaker than transistor M402 means that the discharge current for transistor M402 will be smaller than would have been the case if transistors M403 and M404 were of the same polarity as transistor M402 thereby decreasing the time for which transistor M402 turns on. Conversely, in the case in which PFETs are weaker than NFETs in the IC containing turn-on circuit 210, transistor M402 will be weaker than transistors M403 and M404. Transistors M403 and M404 being stronger than transistor M402 means that the discharge current for transistor M402 will be larger than would have been the case if transistors M403 and M404 were of the same polarity as transistor M402 thereby increasing the time for which transistor M402 turns on. In either case (PFETs are stronger than NFETs or NFETS are stronger than PFETs), the response time of turn-on circuit 210 to turn on transistor MIA is approximately the same.

Figure 5:
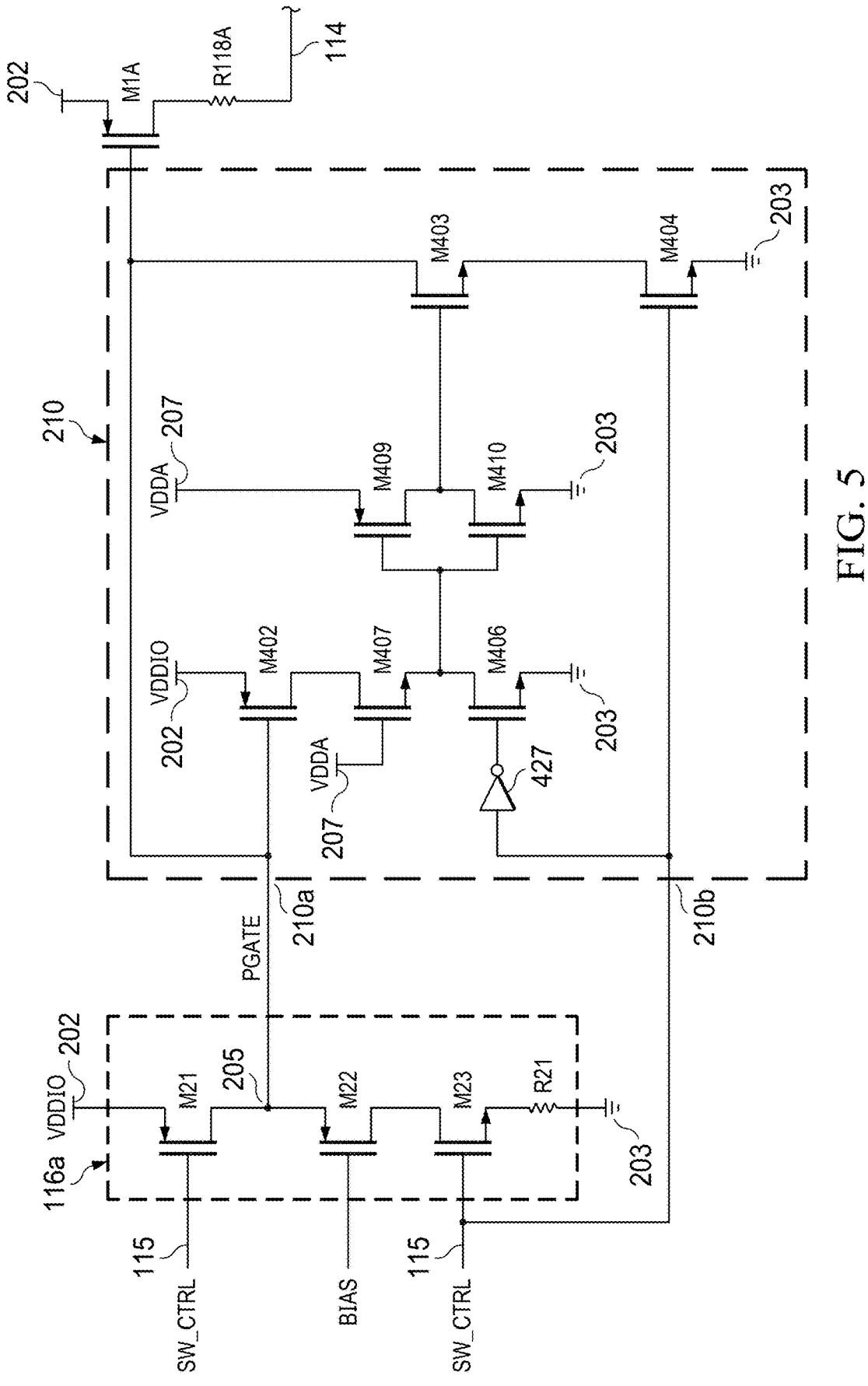
FIG. 5 is a schematic diagram of a predriver and turn-on circuit within the I/O circuit, in another example.

FIG. 5 is a schematic diagram of turn-on circuit 210 which is largely the same as the schematic diagram of FIG. 4. A difference between FIG. 4 and FIG. 5 is that transistor M405 in FIG. 4 is not included in the example of FIG. 5. Another difference is that resistor R42 is not included between the drain of transistor M409 and voltage terminal 203. Instead of the source of transistor M409 being coupled to transistor M405 as in FIG. 4, in FIG. 5, the source of transistor M409 is coupled to the voltage terminal 207.

In both schematic diagram of FIGS. 4 and 5, a bias voltage derived from voltage VDDIO is not needed. Transistor M407, for example, is biased with voltage VDDA, which is a regulated voltage generated internal to the IC containing the I/O circuits 112. Other I/O circuits may require a bias voltage for one or more of the transistors that is derived from the voltage VDDIO. The generation of such a bias voltage requires circuitry. A technical advantage of turn-on circuit 210 is that such circuitry is not needed.

Figure 6:
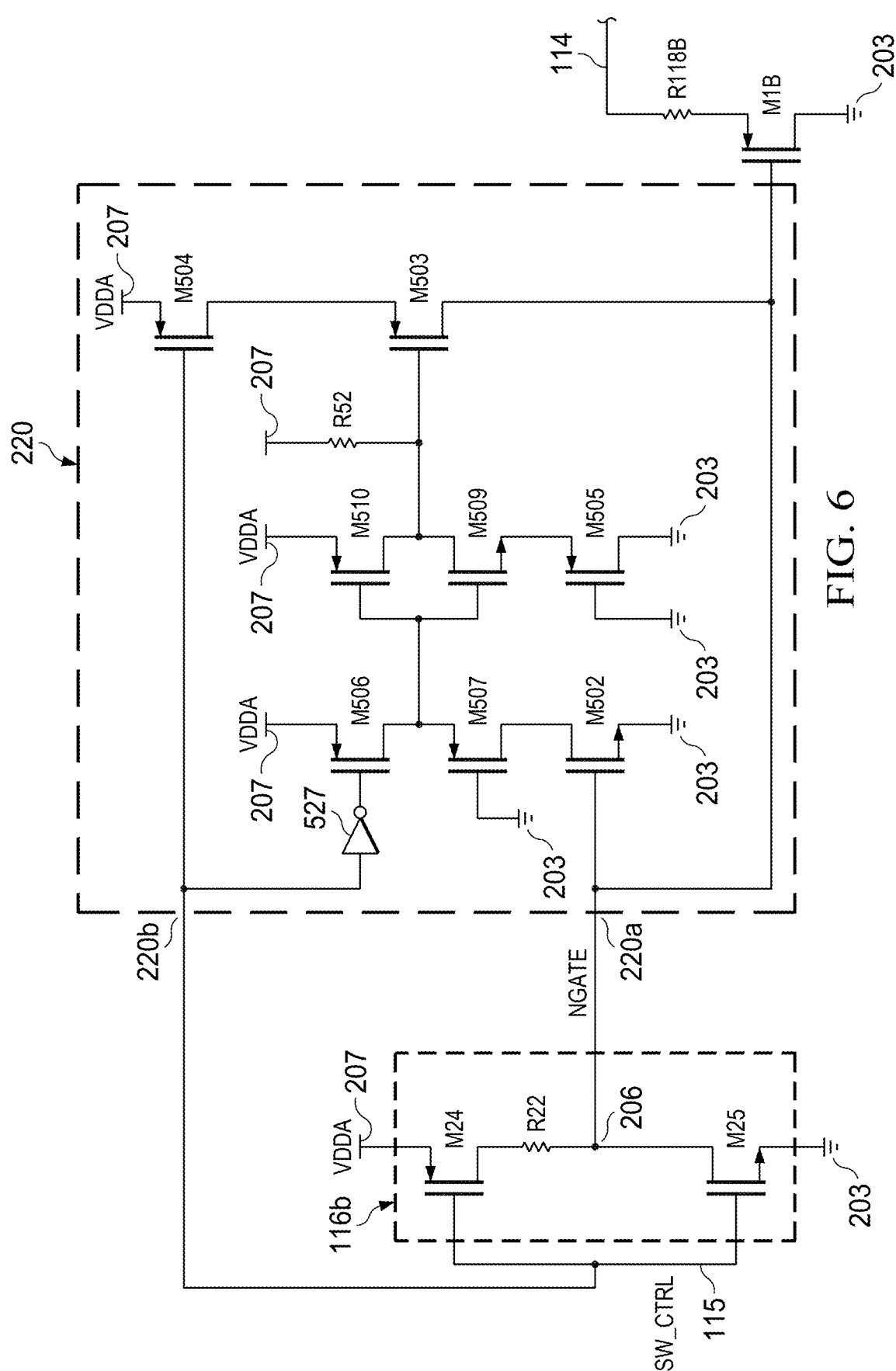
FIG. 6 is a schematic diagram of another predriver and turn-on circuit within the I/O circuit, in an example.

FIG. 6 is a schematic diagram of turn-on circuit 220 for predriver 116*b* and output stage transistor MIB. Turn-on circuit 220 includes transistors M502, M503, M504, M505, M506, M507, M509, and M510, resistor R52, and inverter 527. Transistors M502 and M509 are NFETs, and transistors M503-M507 and M510 are PFETs. The gate of transistor M502 is coupled to input 220*a* and to terminal 206 of predriver 116*b*. The sources of transistors M502 and M505 are coupled to voltage terminal 203 (e.g., ground). The drains of transistors M502 and M507 are coupled together. The gate of transistor M507 is coupled to ground. The source of transistor M507 is coupled to the drain of transistor M506 and to the gates of transistors M509 and M510. The source of transistor M506 is coupled to the voltage terminal 207. The input of inverter 527 and the gate of transistor M504 are coupled to the input 220*b* and receive the SW_CTRL signal 115. The output of inverter 527 is coupled to the gate of transistor M506.

The sources of transistors M510 and M504 are coupled to the voltage terminal VDDA. The drains of transistor M509 and M510 are coupled together and to the gate of transistor M503 and a terminal of resistor R52. The opposing terminal of resistor R52 is coupled to the voltage terminal 207. The sources of transistors M505 and M509 are coupled together. The gate of transistor M505 is coupled to ground. The drain of transistor M504 is coupled to the source of transistor M503, and the drain of transistor M503 is coupled to the gate of transistor M502.

With the SW_CTRL signal 115 at a logic high level, transistors M25 and M506 are on, and transistor M504 is off. Transistor M25 being on causes transistor M502 to be off. Further, with transistor M506 being on, the voltage at the gates of transistors M509 and M510 is at a high enough voltage that transistor M509 is on and transistor M510 is off. Transistor M404 is also off when the SW_CTRL signal 115 is logic high. With transistor M504 off, transistor M503 also is off.

When the SW_CTRL signal 115 becomes logic low, transistors M25 and M506 turn off, and transistor M504 turns on. The voltage on the gate of transistor M510 remains high enough that transistor M510 remains off and transistor M509 remains on. At this point, both transistors M503 and M504 are on. Transistors M503 and M504 are coupled in series between voltage terminal 207 and the gate of transistor M502 and, accordingly, provide a fast charge current path to charge the gate of transistor MIB and the gate of transistor M502 to thereby rapidly turn on transistor MIB when the NGATE voltage reaches the threshold voltage for transistor MIB. With the NGATE voltage at the threshold voltage for transistor MIB, transistor M502 also turns on. When transistor M502 turns on, the gate voltage for transistor M510 is pulled low enough through transistors M507 and M502 to thereby turn on transistor M510. Transistor M510 turning on causes transistor M503 to turn off thereby disabling the fast charge current path for the gate of transistor MIB through transistors M504 and M503.

As was the case for turn-on circuit 210, in turn-on circuit 220 transistor M502 is of a different polarity as transistors M503 and M504. In the example of FIG. 6, transistor M502 is an NFET and transistors M503 and M504 are PFETs. In the case in which PFETs are stronger than NFETs in the IC containing turn-on circuit 220, transistor M502 will be weaker than transistors M503 and M504. Transistors M503 and M504 being stronger than transistor M502 means that the charge current for transistor M502 will be larger than would have been the case if transistors M503 and M504 were of the same polarity as transistor M502 thereby increasing the time for which transistor M502 turns on. Conversely, in the case in which PFETs are weaker than NFETs in the IC containing turn-on circuit 220, transistor M502 will be stronger than transistors M503 and M504. Transistors M503 and M504 being weaker than transistor M502 means that the charge current for transistor M502 will be smaller than would have been the case if transistors M503 and M504 were of the same polarity as transistor M502 thereby decreasing the time for which transistor M502 turns on. In either case (PFETs are stronger than NFETS or NFETS are stronger than NFETs), the response time of turn-on circuit 220 to turn on transistor MIB is approximately the same.

Advantageously, if PFETs are stronger than NFETs in the IC containing the turn-on circuits 210 and 220, the threshold voltage of the PFETs is smaller than the threshold voltage of the NFETs. The threshold voltage of transistor M402 is lower than the threshold voltages of the NFETs in the IC. Accordingly, PFET transistor M402 in turn-on circuit 210 will turn on with a smaller Vgs than NFET transistor M502 in turn-on circuit 220. Accordingly, turn-on circuit 210 includes NFETs (weaker) as transistors M403 and M404 to discharge the gates of PFETs (stronger) M402 and MIA, and turn-on circuit 220 includes PFETs (stronger) as transistors M503 and M504 to charge the gates of NFETs (weaker) M502 and MIB thereby resulting in the response times of turn-on circuits 210 and 220 to turn on their respective transistors MIA and MIB being approximately the same.

Similarly, if NFETs are stronger than PFETs in the IC, the threshold voltage of the NFETs is smaller than the threshold voltage of the PFETs. The threshold voltage of transistor M502 in FIG. 6 is lower than the threshold voltages of the PFETs in the IC. Accordingly, NFET transistor M502 in turn-on circuit 220 will turn on with a smaller Vgs than PFET transistor M402 in turn-on circuit 210. Accordingly, turn-on circuit 220 includes PFETs (weaker) as transistors M503 and M504 to charge the gates of NFETs (stronger) M502 and MIB, and turn-on circuit 210 includes NFETs (stronger) as transistors M403 and M404 to discharge the gates of NFETs (weaker) M402 and MIA thereby resulting in the response times of turn-on circuits 210 and 220 to turn on their respective transistors MIA and MIB being approximately the same.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "ON" or "enabled" means that the conduction channel of the FET is present and drain current may flow through the FET. References herein to a FET being "OFF" or "disabled" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. A circuit, comprising:
a first transistor having a control terminal;
a predriver having an input and an output, the output coupled to the control terminal of the first transistor;
a second transistor of a first polarity having a control terminal coupled to the output of the predriver; and
a third transistor having a second polarity and having first and second terminals, the first terminal of the third transistor coupled to the control terminal of the second transistor; and
a fourth transistor having the second polarity and having first and second terminals, the first terminal of the fourth transistor coupled to the second terminal of the third transistor, and the second terminal of the fourth transistor coupled to a supply terminal.

2. The circuit of claim 1, wherein the predriver is a first predriver and the supply terminal is a first supply terminal, and the circuit further includes:
a fifth transistor having a control terminal;
a second predriver having an input and an output, the output of the second predriver coupled to the control terminal of the fifth transistor;
a sixth transistor of the second polarity having a control terminal coupled to the output of the second predriver; and
a seventh transistor having the first polarity and having first and second terminals, the first terminal of the seventh transistor coupled to the control terminal of the second transistor; and
an eighth transistor having the first polarity and having first and second terminals, the first terminal of the eighth transistor coupled to the second terminal of the seventh transistor, and the second terminal of the eighth transistor coupled to a second supply terminal.

3. The circuit of claim 1, wherein:
the second transistor is a p-channel field effect transistor (PFET);
the third and fourth transistors are n-channel field effect transistors (NFETs); and
the supply terminal is a ground terminal.

4. The circuit of claim 1, wherein:
the second transistor is an n-channel field effect transistor (NFET);
the third and fourth transistors are p-channel field effect transistors (PFETs); and
the supply terminal is a voltage terminal.

5. The circuit of claim 1, wherein the third transistor is configured to turn off in response to the second transistor turning on.

6. The circuit of claim 1, wherein the predriver includes a fifth transistor coupled in series with a resistor between the output and the supply terminal.

7. The circuit of claim 1, wherein the supply terminal is a first supply terminal, the second transistor has first and second terminals, and the circuit further includes:
a fifth transistor having a control terminal and first and second terminals, the control terminal of the fifth transistor coupled to a second supply terminal, and the first terminal of the fifth transistor coupled to the second terminal of the second transistor; and
a sixth transistor having a control terminal and first and second terminals, the control terminal of the sixth transistor coupled to the input of the predriver, and the first terminal of the sixth transistor coupled to the second terminal of the fifth transistor, and the second terminal of the sixth transistor coupled to the first supply terminal.

8. The circuit of claim 1, further comprising a semiconductor die having an externally-accessible terminal, the first transistor has a terminal coupled to the externally-accessible terminal.

9. A circuit, comprising:
a first transistor having a control terminal;
a predriver having an input and an output, the output coupled to the control terminal of the first transistor;
a p-channel field effect transistor (PFET) having a gate coupled to the output of the predriver; and
a first n-channel field effect transistor (NFET) having a source and a drain, the drain of the first NFET coupled to the gate of the PFET; and
a second NFET having a source and a drain, the drain of the second NFET coupled to the source of the first NFET, and the source of the second NFET coupled to a supply terminal.

10. The circuit of claim 9, wherein the PFET is a first PFET, the predriver is a first predriver, the supply terminal is a first supply terminal, and the circuit further includes:
a fifth transistor having a control terminal;
a second predriver having an input and an output, the input of the second predriver coupled to the input of the first predriver, and the output of the second predriver coupled to the control terminal of the fifth transistor;
a third NFET having a gate coupled to the output of the second predriver; and
a second PFET having a source and a drain, the drain of the second PFET coupled to the gate of the third NFET; and
a third PFET having a source and a drain, the drain of the third PFET coupled to the source of the second PFET, and the source of the third PFET coupled to a second supply terminal.

11. The circuit of claim 9, wherein the first NFET is configured to turn off in response to the PFET turning on.

12. The circuit of claim 9, wherein the predriver includes:
a second transistor having first and second terminals, the first terminal of the second transistor coupled to the output of the predriver; and
a resistor having a first terminal coupled to the second terminal of the second transistor and having a second terminal coupled to the supply terminal.

13. The circuit of claim 9, wherein the supply terminal is a first supply terminal, the PFET has a source and a drain, and the circuit further includes:

a second transistor having a control terminal and first and second terminals, the control terminal of the second transistor coupled to a second supply terminal, and the first terminal of the second transistor coupled to the drain of the PFET; and a third transistor having a control terminal and first and second terminals, the control terminal of the third transistor coupled to the input of the predriver, and the first terminal of the third transistor coupled to the second terminal of the second transistor, and the second terminal of the third transistor coupled to the first supply terminal.

14. The circuit of claim 9, further comprising a semiconductor die having an externally-accessible terminal, the first transistor has a terminal coupled to the externally-accessible terminal.

15. A circuit, comprising:

a first n-channel field effect transistor (NFET) having a gate;

a predriver having an input and an output, the output coupled to the gate of the first NFET;

a second NFET having a gate coupled to the output of the predriver; and a first p-channel field effect transistor (PFET) having a source and a drain, the drain of the first PFET coupled to the gate of the second NFET; and a second PFET having a source and a drain, the drain of the second PFET coupled to the source of the first PFET, and the source of the second PFET coupled to a supply terminal.

16. The circuit of claim 15, wherein the predriver is a first predriver, the supply terminal is a first supply terminal, and the circuit further includes:

a third PFET having a gate;

a second predriver having an input and an output, the input of the second predriver coupled to the input of the first predriver, and the output of the second predriver coupled to the gate of the third PFET;

a third NFET having a gate coupled to the output of the second predriver; and a fourth PFET having a source and a drain, the drain of the fourth PFET coupled to the gate of the third NFET; and a fifth PFET having a source and a drain, the drain of the fifth PFET coupled to the source of the fourth PFET, and the source of the fifth PFET coupled to a second supply terminal.

17. The circuit of claim 16, wherein the fifth PFET has a gate coupled to the input of the predriver.

18. The circuit of claim 15, wherein the first PFET is configured to turn off in response to the second NFET turning on.

19. The circuit of claim 15, wherein the predriver includes:

a third PFET having a source and a drain; and a resistor having a first terminal coupled to the drain of the third PFET and having a second terminal coupled to the output of the predriver.

20. The circuit of claim 15, further comprising a semiconductor die having an externally-accessible terminal, the first NFET has a drain, and the drain of the first NFET coupled to the externally-accessible terminal.

\*    \*    \*    \*    \*